(12) United States Patent
Boubezari et al.

(10) Patent No.: US 6,363,520 B1
(45) Date of Patent: Mar. 26, 2002

(54) METHOD FOR TESTABILITY ANALYSIS AND TEST POINT INSERTION AT THE RT-LEVEL OF A HARDWARE DEVELOPMENT LANGUAGE (HDL) SPECIFICATION

(75) Inventors: Samir Boubezari, Mountain View, CA (US); Eduard Cerny; Bozena Kaminska, both of Montreal (CA); Benoit Nadeau-Dostie, Aylmer (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 09/098,555

(22) Filed: Jun. 16, 1998

(51) Int. Cl.[7] .................. G06F 17/50; G06F 17/10; G06F 7/60
(52) U.S. Cl. ................... 716/18; 716/2; 716/4
(58) Field of Search ................ 716/18, 4

(56) References Cited

U.S. PATENT DOCUMENTS

| | | | | |
|---|---|---|---|---|
| 4,791,578 A | * | 12/1988 | Fazio et al. | 364/488 |
| 5,043,986 A | | 8/1991 | Agrawal et al. | 371/25.1 |
| 5,329,533 A | | 7/1994 | Lin | 371/22.3 |
| 5,379,303 A | * | 1/1995 | Levitt | 371/27 |
| 5,450,414 A | | 9/1995 | Lin | 371/22.3 |
| 5,513,123 A | * | 4/1996 | Dey et al. | 364/489 |
| 5,828,828 A | * | 10/1998 | Lin et al. | 395/183.06 |
| 6,038,691 A | * | 3/2000 | Nakao et al. | 714/733 |

OTHER PUBLICATIONS

H. Fujiwara, Computational Complexity of Controllability/Observability Problems for Combinational Circuits, 18th International Symposium on Fault–Tolerant Computing, pp. 64–69, Jun. 1988.*

C.H. Chen et al., An Approach to Functional Level Testability Analysis, 1989 International Test Conference, pp. 373–380, Aug. 1989.*

C.H. Chen et al., Behavioral Synthesis for Testability, 1992 IEEE/ACM International Conference on Computer–Aided Design, pp. 612–615, Nov. 1992.*

C.P. Ravikumar et al., HISCOAP: A Hierarchical Testability Analysis Tool, 8th International Conference on VLSI Design, pp. 272–277, Jan. 1995.*

Y. Fang et al., Efficient Testability Enhancement for Combinational Circuit, 1995 International Conference on Computer Design, pp. 168–172, Oct. 1995.*

S. Boubezari et al., Testability Analysis and Test–Point Insertion in RTL VHDL Specifications for Scan–Based BIST, IEEE Transactions on Computer–Aided Design of Integrated Circuits and Systems, pp. 1327–1340, Sep. 1999.*

(List continued on next page.)

*Primary Examiner*—Matthew Smith
*Assistant Examiner*—A. M. Thompson
(74) *Attorney, Agent, or Firm*—Sheridan Ross P.C.

(57) ABSTRACT

A method is provided for producing a synthesizable RT-Level specification, having a testability enhancement from a starting RT-Level specification representative of a circuit to be designed, for input to a synthesis tool to generate a gate-level circuit. The method includes the steps of performing a testability analysis on a Directed Acyclic Graph by computing and propagating Testability Measures forward and backward through VHDL statements, identifying the bits of each signal and/or variable, and adding test point statements into the specification at the RT-Level to improve testability of the circuit to be designed. The computation of Controllability and Observability method is purely functional, and does not subsume the knowledge of a gate-level implementation of the circuit being analyzed.

36 Claims, 7 Drawing Sheets

OTHER PUBLICATIONS

M.H. Gentil et al., A New High Level Testability Measure: Description and Evaluation, 12th IEEE VLSI Test Symposium 1994, pp. 421–426, Apr. 1994.*

T.C. Lee et al., Behavioral Synthesis for Easy Testability in Data Path Allocation, IEEE 1992 International Conference on Computer Design, pp. 29–32, Oct. 1992.*

P. Vishakantaiah et al., "AMBIANT': Automatic Generation of Behavioral Modifications for Testability", IEEE ICCD, pp. 63–66, Oct. 1993.

S. Bhattacharya et al., "Transformations and Resynthesis for Testability of RT–Level Control–Data Path Specifications", IEEE Trans. on (VLSI) Systems, vol. 1, No. 3, Sep. 1993, 15 pp.

H. Chen et al., "Structural and Behavioral Synthesis for Testability Techniques", IEEE Trans. on Cad, vol. 13, No. 6, Jun. 1994.

W. Mao et al., "Improving Gate–Level Fault Coverage by RTL Fault Grading", IEEE ITC pp. 150–159, 1996.

C. Papachristou et al., "Test Synthesis in the Behavioral Domain", IEEE International Test Conference, 1995, pp. 693–702.

B.H. Seiss et al., "Test Point Insertion for Scan–Based BIST", Proc. of European Test Conference, pp. 253–262, 1991.

C.H. Cho et al., "B–algorithm: A Behavior Test Generation Algorithm", IEEE International Test Conference, 1994, pp. 968–979.

X. Gu et al., "Testability Analysis and Improvement from VHDL Behavioral Specifications", Proc. EURO–DAC, pp. 644–649, 1994.

L.J. Avra et al., "High Level Synthesis of Testable Designs: An Overview of University Systems", IEEE TC Test Synthesis Seminar, 1994, pp. 1.1.1.–1.1.8.

S. Dey et al., "Transforming Behavioral Specifications to Facilitate Synthesis of Testable Designs" IEEE ITC pp. 184–193, 1994.

* cited by examiner

```
entity MOORE is          -- Moore machine
  port(X, CLOCK: in BIT;
    Z: out BIT);
end;
architecture BEHAV of MOORE is
  type STATE_TYPE is (S0, S1, S2, S3);
    signal  CURRENT_STATE,  NEXT_STATE:
STATE_TYPE;
begin
  -- Process to hold combinational logic
  COMBIN: process(CURRENT_STATE, X)
  begin
    case CURRENT_STATE is
      when S0 =>
        Z <= '0';
        if X = '0' then
          NEXT_STATE <= S0;
        else
          NEXT_STATE <= S2;
        end if;
      when S1 =>
        Z <= '1';
        if X = '0' then
          NEXT_STATE <= S0;
        else
          NEXT_STATE <= S2;
      when S2 =>
        Z <= '1';
        if X = '0' then
          NEXT_STATE <= S2;
        else
          NEXT_STATE <= S3;
        end if;
      when S3 =>
        Z <= '0';
        if X = '0' then
          NEXT_STATE <= S3;
        else
          NEXT_STATE <= S1;
        end if;
    end case;
  end process COMBIN;
  -- Process to hold synchronous elements (flip-
  flops)
  SYNCH: process
  begin
    wait until CLOCK = '1';
    CURRENT_STATE <= NEXT_STATE;
  end process SYNCH;
end BEHAV;
```

Fig. 2

```
...
Signal A, B, C, Z: bit;
P1: Process
Variable V: bit;
Begin
    V := A and B;
    V := V or C;
    Z <= V;
end Process P1;
    ...
```

Fig. 7(a)

DAG representation →

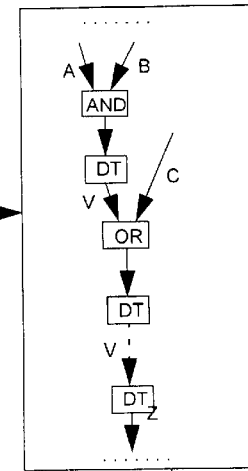

Fig. 7(b)

DAG modification ↓

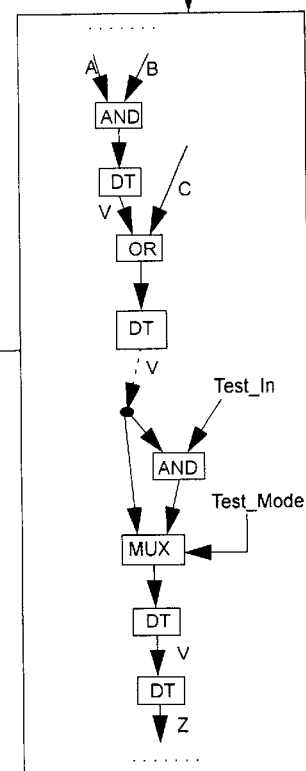

Fig. 7(c)

← VHDL modification

```
    ...
Function Insert_AND_OR
    (V: bit; Ctrp: boolean; T_In: bit; TM: boolean) return bit is
    Variable VAR: bit;
Begin
    VAR := V;
    if (TM) then
        if (Ctrp) then
            VAR := VAR and T_In;
            Return VAR;
        else
            VAR := VAR or T_In;
            Return VAR;
        end if;
    else
        Return VAR;
    end if;
end Insert_AND_OR;
    ...
Signal A, B, C, Z: bit;
P1: Process
Variable V: bit;
Begin
    V := A and B;
    V := V or C;
    V := Insert_AND_OR(V, 1, Test_In, Test_Mode);
    Z <= V;
end Process P1;
    ...
```

Fig. 7(d)

```
Signal A, B, C, D,Z: integer range 0 to 7;
P1: Process
variable V: integer range 0 to 7;
Begin
    if (D >= 2) Then
            V := A + B;
    else
            V := C + D;
    end if;
    Z <= V;
end Process P1;
```

Fig. 8(a)

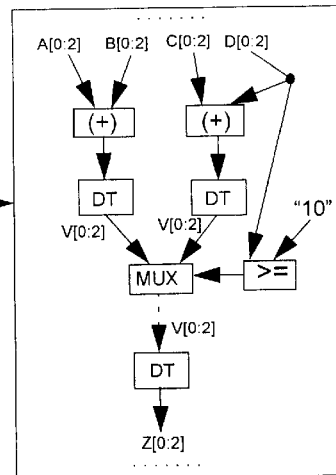

DAG representation →

Fig. 8(b)

```
Function Insert_Test_Point(VAR: integer 0 to 3; size: integer;
        position: integer; Ctrp: boolean T_I: bit ;TM:boolean) is
variable V_int: integer range 0 to 7;
Variable V_vect: bit_vector(size-1 downto 0);
begin
    if(TM) then
            V_vect = conv_bit_vector(VAR, size);
        if (Ctrp) then
                V_vect(position) := T_I AND V_vect(position);
                V_int := conv_integer(V_vect);
                return (V_int);
            else
                V_vect(position) := T_I OR V_vect(position);
                V_int := conv_integer(V_vect);
                return (V_int);
            end if;
        else
            return (VAR);
        end if;
end Insert_Test_Point;

Signal A, B, C, D, Z: Integer range 0 to 7;
P1: Process
variable V: integer range 0 to 7;
Begin
    If (D >= 2) Then
            V := A + B;
    else
            V := C + D;
    end if;
    V:=Insert_Test_Point(V, 4, 0, 0, Test_In, Test_Mode);
    Z <= V;
end Process P1;
```

← VHDL modification

DAG modification ↓

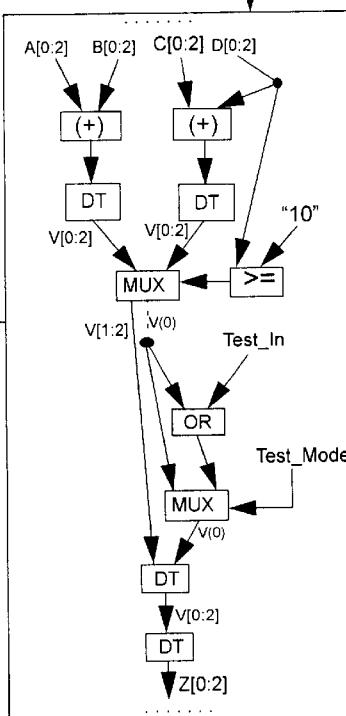

```
. . .
Signal A, B, C, Z: bit;
P1: Process
Variable V: bit;
Begin
    V := A and B;   -- S1
    V := V or C;    -- S2
    Z <= V;         -- S3
end Process P1;
. . .
```
Fig. 9(a)
DAG representation →
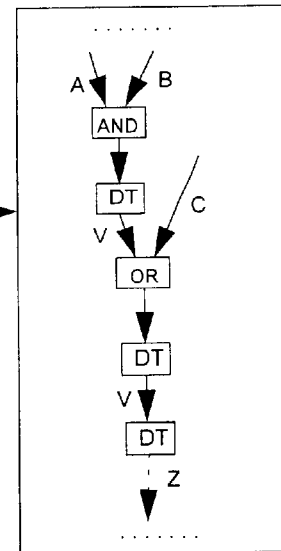
Fig. 9(b)
↓ DAG modification
```
. . .
Signal A, B, C, Z,Reg: bit;
P1: Process
Variable V: bit;
Begin
   V := A and B;
   V := V or C;
   Z <= V;
end Process P1;
P_Obs: Process
Begin
   wait until Clk = '1';
   If (Test_Mode) Then
       Reg <= Z;
   end if;
end Process P_obs;
. . .
```
← VHDL modification
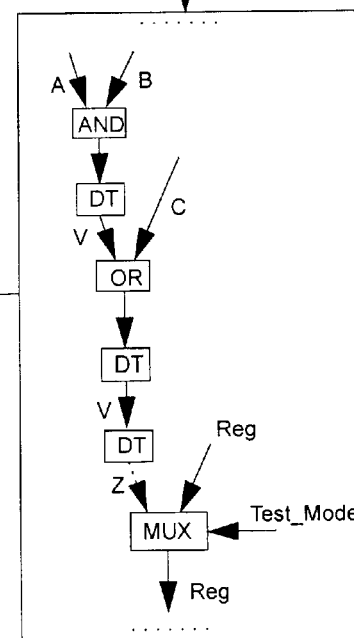
Fig. 9(d)
Fig. 9(c)

METHOD FOR TESTABILITY ANALYSIS AND TEST POINT INSERTION AT THE RT-LEVEL OF A HARDWARE DEVELOPMENT LANGUAGE (HDL) SPECIFICATION

The present invention relates to method of producing a synthesizable Register Transfer (RT) Level VHDL specification for input to a synthesis tool to generate a gate-level circuit having testability enhancement.

BACKGROUND OF THE INVENTION

VLSI circuit complexity has made testing difficult and more expensive. Increasing the testability of a design becomes one of the important issues in the design cycle of VLSI circuits. It helps to achieve the high test quality and to reduce test development and test application costs. In the past, it was possible to add Design-for-Testability (DFT) circuits manually after logic synthesis. But current needs for a shorter time to market makes this approach an unaffordable design bottleneck. Ignoring DFT during the design cycle affects product quality and introduces schedule delays. Most industrial digital designs use automated synthesis and DFT can be achieved by incorporating test and synthesis into a single methodology that is as automated as possible. Indeed, considering testability during the design synthesis, as opposed to traditional approaches of making back-end modification after an implementation has been generated, can reduce design time. Even more important, the testability enhancement at the entry level to a synthesis tool makes it independent of the tool and the implementation technology. It becomes part of the design specification.

As indicated below, several methods have been proposed in the literature to address the problem of testability analysis at higher levels of abstraction. Most of them concentrate on improving the testability of datapaths, assuming that the controller can be tested independently and that its outgoing control signals to the datapath are fully controllable in test mode. However, even when both the controller and the datapath are individually testable, the composite circuit may not be. A method based on testability analysis at the behavioural level was presented in C. Papachristou and J. Carletta, "Test Synthesis in the Behavioural Domain", IEEE International Test Conference, 1995, pp. 693, 702. While the authors perform the test insertion of the datapath at the behavioural level, test point insertion for the controller and the interface between the datapath and the controller, is performed at the structural level. Moreover, even if the authors use two metrics for testability analysis at the behavioural level, test overhead can be very large for practical circuits. In contradistinction, the present invention considers the Controllability and the Observability of each bit of each signal and/or variable declared in the VHDL specification after data type conversion. In addition, test point insertion is also performed at the bits of each signal and/or variable identified as hard to detect areas instead of all bits, as used in previous methods (see for example P. Vishakantaiah et al., "Automatic Test Knowledge Extraction from VHDL (ATKET)", IEEE Design Automation conference, pp. 273–278); X. Gu, et al., "Testability Analysis and Improvement from VHDL behavior Specification", Proc. EURO-DAC, pp. 644–649, 1994; A. Debreil, P. Oddo, "Synchronous Designs in VHDL', Euro-VHDL 93, pp. 486–491, and this can reduce the test overhead for practical circuits and makes test point insertion more oriented to the hardware represented by the VHDL specification.

Another method which considers testability features at the behavioral level was presented in X. Gu, et al., "Testability Analysis and Improvement from VHDL behavior Specification", Proc. EURO-DAC, pp. 644–649, 1994. However, the paper analyzes only very simple VHDL constructs to perform test point insertion at the RT-Level. In addition, the TM computations based on Controllability and Observability transfer functions are very complex for large primitive functional modules and involve more hardware for test point insertion.

Other methods (see S. Dey and M. Potkonjak, "Transforming Behavioural Specifications to Facilitate Synthesis of Testable Designs", ITC pp. 184–193, 1994; P. Vishakantaiah et al, "AMBIANT: Automatic Generation of Behavorial Modifications for Testability", IEEE ICCD, pp. 63–66, October 1993; A. Debreil, P. Oddo, "Synchronous Designs in VHDL', Euro-VHDL 93, pp. 486–491) work by modifying a behavioral description before high level synthesis begins, however they concentrate on the testability of the synthesized datapath, without outlining a test scheme for testing the datapath and the controller as a whole.

Finally, recently an RT-Level testability analysis method has been proposed in W. Mao and R. K. Gulati, "Improving Gate-Level Fault coverage by RTL Fault Grading", ITC pp. 463–472, 1996. The authors use verilog RT-Level models and functional verification patterns to evaluate the fault coverage of the resulting circuit. However, the paper does not propose test point insertion at the RT-Level to improve the testability of the resulting circuit.

SUMMARY OF THE INVENTION

The primary objective of the method of the present invention is to raise the level of abstraction at which testability analysis and test point insertion is performed. The present invention proposes a new testability analysis and test point insertion method at the RT-level assuming full scan and a Built In Self Test (BIST) design environment. The method uses as the starting point a specification given at the synthesizable RT-Level VHDL. The specification is analyzed to produce an intermediate representation, called the VHDL Intermediate Format (VIF), and transformed into a Directed Acyclic Graph (DAG) on which testability analysis is performed by computing and propagating Testability Measures (TMs) forward and backward through the VHDL statements. These measures are then used to identify the bits of each signal and/or variable on which faults are hard to detect. Finally, test point insertion is performed to improve testability, again at the RT-Level, by adding new VHDL test statements.

The computation of Controllability and Observability method is purely functional, that is, it does not subsume the knowledge of a gate-level implementation of the circuit being analyzed. Therefore, it enables the computation of testability estimations with a high degree of accuracy for circuits on which existing tools fail due to the enormous amount of information which must be handled when considering the structural implementation of the circuit.

BRIEF DESCRIPTION OF THE DRAWINGS

These and other features of the invention will become more apparent from the following description in which reference is made to the appended drawings in which:

FIG. 2 is a VHDL specification which represents a Moore finite state machine with 4 states (S0, S1, S2, S3) and one output Z;

FIGS. 6(a)–(c) illustrate test point implementation at gate level in which FIG. 6(a) shows a circuit before test point insertion; FIG. 6(b) shows insertion of an observation point at signal S and FIG. 6(c) shows insertion of an AND-gate as a control point at signal S;

FIGS. 7(a)–(c) show control point insertion of a single assignment statement where FIG. 7(a) shows the original VHDL specification, FIG. 7(b) shows the DAG before test insertion and FIG. 7(c) shows the VHDL specification after test statement insertion;

FIGS. 8(a)–(d) illustrate control point insertion for a conditional statement in which FIG. 8(a) is the original VHDL specification; FIG. 8(b) is the DAG before test insertion; FIG. 8(c) is the DAG after test insertion and FIG. 8(d) is the VHDL specification after test statement insertion;

FIGS. 9(a)–(d) illustrate observability point insertion in which FIG. 9(a) is the original VHDL specification; FIG. 9(b) is the DAG before test insertion; FIG. 9(c) is the DAG after test insertion and FIG. 9(d) is the VHDL specification after test statement insertion.

DESCRIPTION OF THE PREFERRED EMBODIMENT OF THE INVENTION

While the method of the present invention is described herein with reference to VHDL specifications, it is to be understood that the invention is not limited thereto and that the principles of the invention are equally applicable to other known specifications, such as Verilog, for example.

Figure 1:
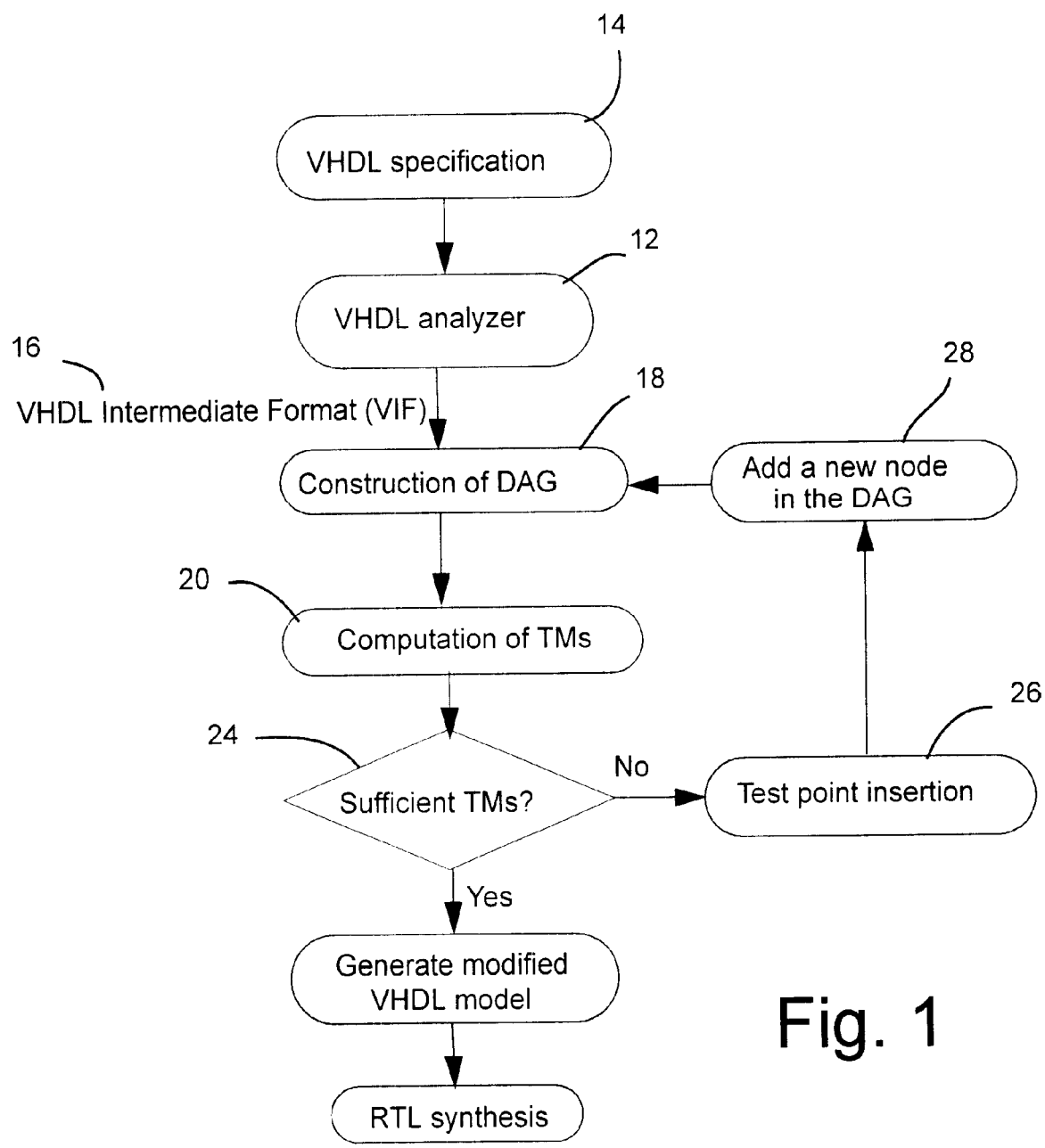
FIG. 1 illustrates the overall structure of the testability analysis environment of the present invention.

FIG. 1 illustrates the overall structure 10 of the testability analysis environment of the present invention which can operate as a front-end to RT-Level synthesis tools such as Synopsys. In the first step, a VHDL analyzer 12 from LEDA as disclosed in C. H. Chen and P. R. Menon, "An Approach to Functional Level Testability Analysis", International Test Conference, pp. 373–379, 1989, is used to process a starting VHDL specification 14 to produce a VHDL Intermediate Format representation 16 and to identify all registers (full scan is assumed) and sequential VHDL statements. A Directed Acyclic Graph (DAG) 18 is used to store this information by linking the present states of registers with the next states through the VHDL statements. Testability Measures (TMs) are then computed at 20 using DAG 18 by initializing the Controllability of primary and pseudo primary inputs to 0.5 (both 0 and 1), and the Observability of primary and pseudo-primary outputs to 1, and by propagating them forward and backward through the VHDL statements. The VHDL statements are converted to operate at the bit level and modeled by their Boolean functional models. These models are described by VHDL operations using signals and variables as operands.

The present invention proposes an efficient method for propagating TMs through such VHDL operators. The method allows the identification of hard-to-detect bits in the signals and variables of the VHDL specification. This information is used to insert VHDL test statements in the VHDL specification by locally converting the affected signal/variable to the bit-level and back.

As a result, the method of the present invention produces a synthesizable RT-Level VHDL specification which can be input to a synthesis tool to generate a gate-level circuit that includes a testability enhancement. The algorithm illustrated in FIG. 1 may implemented using the C language.

Construction of the Direct Acyclic Graph

As shown in FIG. 1 and indicated above, the VHDL specification is compiled into a VIF representation and then a DAG is constructed that represents the flow of information and data dependencies from primary and pseudo-primary inputs (DAG's inputs) to primary and pseudo-primary outputs (DAG's outputs). Each internal node of the DAG corresponds to an operation in the VHDL specification. Source and sink nodes represent present and next, respectively, state and primary inputs and outputs.

VHDL operations generally consist of arithmetic operations (addition, subtraction, multiplication), relational operations (various comparators), data transfer operations and logical operations (AND, OR, NAND, . . . etc.). The present and the next states are given by synthesized registers in the VHDL specification. Edges represent the flow of information from the present states and primary inputs through the operators to the next states and primary outputs. These edges are signals and/or variables declared in the VHDL specification and virtual signals and/or variables.

A virtual signal and/or variable is defined as an unnamed signal and/or variable formed by an expression which is not a simple signal and/or variable name. For example, from the following VHDL specification, two virtual signals (S_v1, S_v2) and two virtual variables (V_v1 and V_v2) are defined:

. . .

Signal A, B, C, D, E: integer;

Process (A, B, C, D, E)

Variable V: integer;

begin

V:=(A+B)+C;

S<=(V+D)+E;

End Process;

. . .

S_v1:(V+D)
S_v2:(V+D)+E
V_v1:(A+B)
V_v2:(A+B)+C

While the entire language is supported by the VHDL analyzer; the method of the present invention supports only synchronous synthesizable VHDL constructs which are accepted by commercial synthesis tools (Snyopsys, Mentor, Cadence, . . . etc.)

The construction of the Directed Acyclic Graph involves the following five steps:

1. Generation of a Control and Data Flow Graph (CDFG) for each process of the VHDL specification.
2. Unrolling all For-Loops and expansion of procedures and functions by adding new nodes to the CDFG.
3. Conversion of data types to bits.
4. Translation of the CDFG into a DAG.
5. Connection of DAG graphs of individual processes to produce a global DAG.

Each of these steps is described below.

Generation of CDFG

Each VHDL process can be transformed into a Control Flow Graph (CFG) to represent the control flow of operations. The CFG is a directed graph defined as:

CFG=(V,E), where

V is a set of nodes corresponding to the different VHDL sequential statements:

$V=V_w \cup V_b \cup V_l \cup V_e$, where $V_w$ is the set of synchronization nodes (wait statements),
$V_b$ is the set of conditional statement nodes (if, case),
$V_l$ is the set of for . . . loop statement nodes,
$V_e$ is the set of other nodes (signal/variable assignments, procedure calls, . . . ), and E is the set of edges representing the flow of control.

Each node of a CFG is associated with a Data Flow Graph. The DFG consists of a set of nodes and edges where each node represents one operation in the VHDL specification and each edge represents signals and variables connected the nodes. There is an edge from node $o_i$ to node $o_j$ if the result of the operation at node $o_i$ is input to node $o_j$. A CFG in which each node is a DFG is called a Control and Data Flow Graph or CDFG.

Loop Unrolling and Expansion of Procedures/Functions

For-Loop statements are used to repeat a sequence of operations for a constant number of times. Thus, the result of synthesis would be a replication of the hardware corresponding to the statements inside the loop, one for each iteration. Each procedure call is expanded in-line. The contents of the procedure are first copied into the process in place of the call. Then, the actual parameters are substituted for the formal parameters of the procedure. Functions are expanded in a similar fashion except that a function is expanded immediately before the expression that calls it. As a result of loop unrolling and expansion of procedure/ functions, the CDFG is augmented by new nodes.

Data Type Conversion

All synthesized VHDL data types are converted into bits. An enumerated type is defined by listing all its possible values. The main issue with enumerated types is their encoding. Enumerated values are encoded by default into bit-vectors whose length is determined by the minimum number of bits required to code the number of enumerated values and the actual code assigned to each value corresponds to the binary representation of the position in the type declaration (starting from zero). Or subtypes are defined using subranges that impose bounds on the possible values. They are encoded using bit-vectors whose length is the minimum necessary number of bits to hold the defined range. If the range includes negative numbers, it is encoded as a 2's-complement bit-vector.

Translation of the CDFG into Directed Acyclic Graph

The next step is to translate the resulting CDFG into a DAG. As stated, each node corresponds to a VHDL operation and edges correspond to signals/variables and virtual signals/variables connecting the nodes. Synchronous registers are inferred on signals and some variables are assigned in a clocked process. However, a DAG is obtained when the present and the next states of registers are separated into separate nodes. The source nodes are the primary inputs and present state values of registers and the sink nodes are the primary outputs and the next-state values. The primary inputs (outputs) of the DAG are all the input (output) signals of the entity port declaration and they correspond to all signals that are only read (assigned) and not assigned (read) in the VHDL specification. Pseudo-primary inputs (outputs) correspond to synthesized register outputs (inputs). The algorithm to identify the synthesized registers in the VHDL specification is the same as used by most synthesis tools.

Identification of Multiplexers

The following description provides a suited translation for the VHDL conditional statements if and case. A new node type is added to the DAG representing a multiplexer operation. In fact, each conditional statement if and case is translated into a set of multiplexers having one output for each signal/variable assigned within the conditional statement. The condition expression translates into a set of nodes which feeds the control input of each multiplexer. The data inputs to each multiplexer are fed from the nodes of the corresponding expression being assigned. Thus, to translate each conditional statement to a multiplexer operation, it is necessary to find its scope, i.e., its corresponding end-statement.

Connection of Processes

A VHDL specification consists of a set of interacting processes (clocked and unclocked). Entity ports and internal signals, declared in the VHDL architecture, are used to communicate between the processes. The connection between processes is represented as a Directed Graph. However, as indicated earlier, each VHDL process can be transformed into a CDFG which is represented as a DAG. Hence, the global VHDL specification is also represented as a DAG. The following description, which refers to FIG. 2, illustrates the overall construction.

Figure 3:
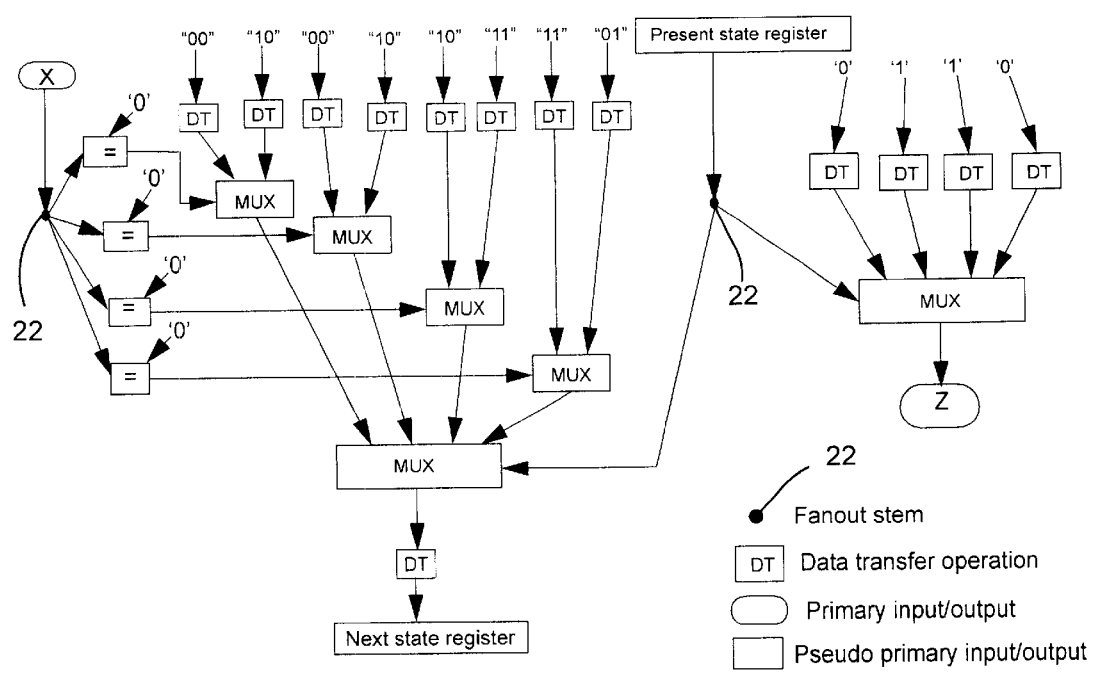
FIG. 3 illustrates a Direct Acrylic Graph for Testability Measures computation of the Moore State machine illustrated in FIG. 2.

FIG. 2 is a VHDL specification which represents a Moore finite state machine with four states S0, S1, S2, S3 and one output Z. The specification consists of two processes: COMBIN which is clocked and SYNCH which is unclocked. Its DAG is shown in FIG. 3, which also shows the primary and pseudo-primary inputs/outputs. The signal CURENT_STATE is synthesized as a register and thus becomes a pseudo-primary two bit-wide input/output since it is declared as an enumerated data type of four possible values. The states or constants S0, S1, S2, and S3 are encoded as 00, 01, 10, and 11, respectively. Each multiplexer operation corresponds to a conditional statement. Fan-out stems are also identified by the method of the present invention, as shown at 22 in FIG. 3.

Testability Computation in the DAG of a VHDL Specification

Most previous methods in testability analysis are restricted to circuits consisting of logic gates only. This implies that circuits containing complex functional modules must be expanded to a gate-level model. In contrast, the method of the present invention handles all VHDL operations at the functional level in addition to logical operations. The present invention supports the following operators: n-bit adders, n-bit comparators (<, <=, =, . . . etc.), n-bit multipliers, n-bit subtractors, and multiplexers inferred by conditional statements. All of these are represented functionally which means that Controllability and Observability propagation through them is exact. This is not the case with gate-level models because reconvergent fanout in such models introduces errors in the calculations. The present method computes a Controllability of zero ($C_0$) and of one ($C_1$), and Observability (O) values for each bit of each signal and variable after data type conversion. The following description describes the propagation of $C_0$, $C_1$ and O through typical VHDL operators.

Combinational Controllability is defined as the probability that a signal s has a specific value (see C. H. Chen and P. R. Menon, "An Approach to Functional Level Testability Analysis", International Test Conference, pp. 373–379, 1989). There are two measures: 1-Controllability ($C_1(s)$) and 0-Controllability ($C_0(s)$) such that $C_0(s)=1-C_1(s)$.

Combinational Observability O(l, s) of a line l is defined as the probability that a signal change on l will result in a signal change on an output s. For multiple output modules, the Observability of a line must be computed relative to each output and the overall Observability O(l) of l is given by max, [O(l, s)]. Thus max, [O(l, s)] simply refers to the maximum one of the observabilities computed for all of the outputs of the multiple output module.

Controllability Calculations

The following description outlines the formulas for determining the Controllability on an output of a VDHL operator given the Controllability on the inputs. The Controllability formulas for logical operators can be found in P. H. Bardel et al., "Built-In Test for VLSI; Pseudorandom Techniques", Wiley Inter-Science, 1987.

Controllability of the Outputs of an N-Bit Adder

It is necessary to compute the Controllability on the outputs of an n-bit adder, given the Controllability on its inputs and assuming that the inputs are independent. When two n-bit binary numbers a and b are added, each bit of the sum s is a function of the corresponding bits of a and b and of the carry from the next less significant bits. The truth table for the $i^{th}$ sum bit $s_i$ and the $(i+1)^{th}$ carry bit $c_{i+1}$ are shown in Table 1.

TABLE 1

The Truth Table of a 1-bit Adder

| $c_i$ | $a_i$ | $b_i$ | $s_i$ | $c_{i+1}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

The 1-Controllability measures $C_1(s_i)$ and $C_1(c_{i+1})$ can be computed by summing up the minterms leading to 1, as follows:

$$C_1(s_i) = C_0(c_i) \times (C_1(a_i) \times C_0(b_i) + C_0(a_i) \times C_1(b_i)) + C_1(c_i) \times (C_0(a_i) \times C_0(b_i) + C_1(a_i) \times C_1(b_i)).$$

$$C_1(c_{i+1}) = C_0(c_i) \times C_1(a_i) \times C_1(b_i) + C_1(c_i) \times (1 - C_0(a_i) \times C_0(b_i))$$

Since $C(c_i)=1-C_1(c_i)$, $C_0(a_i)=1-C_1(a_i)$ and $C_0(b_i)=1-C_1(b_i)$, $C_1(s_i)$ and $C_1(c_{i+1})$ can be rewritten as follows:

$$C_1(s_i) = \alpha + C_1(c_i) - 2 \times (\alpha \times C_1(c_i)) \quad (1)$$

$$C_1(c_{i+1}) = \alpha \times C_1(c_i) + C_1(a_i) \times C_1(b_i) \quad (2)$$

$$\text{where } \alpha = C_1(a_i) + C_1(b_i) - 2 \times C_1(a_i) \times C_1(b_i) \quad (3)$$

Note that $\alpha$ is the probability that $(a_i \oplus b_i)=1$ and, consequently, $C_1(s_i)$ is the probability that $(a_i \oplus b_i \oplus c_i)=1$.

Figure 4:
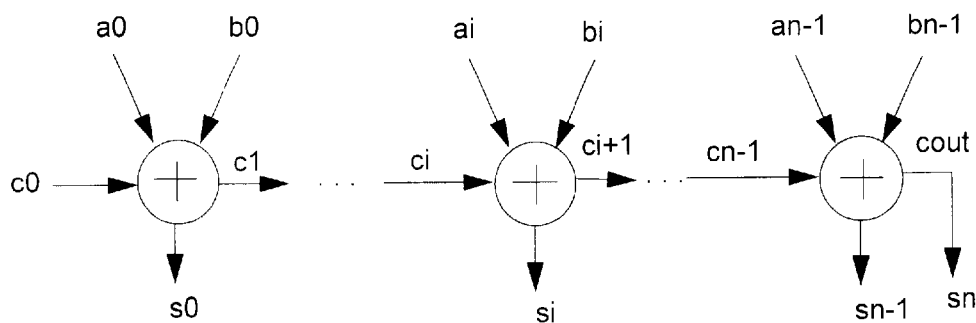
FIG. 4 illustrates a ripple-carry adder composed of n full adders.

To compute the Controllability of each output of an n-bit adder, a cascade of n full adders configured as a ripply-carry adder can be used, as shown in FIG. 4. There is no reconvergent fanout in this circuit and all inputs are independent; hence, the Controllability computed on this tree structure is exact. To find the Controllability measure $C_1(s_i)$ at the output $s_i$, Equations (1), (2) and (3) can be used for each 1-bit adder, and bit i can be evaluated when bits 0, 1, ..., i-1 have been computed. The calculation can be made in linear time in terms of the number of inputs. The same structure can be used to compute the Controllability of a subtractor using 2's-complement representation.

Controllability of the Output of an N-Bit Multiplier

To compute the Controllability of the outputs of an n-bit multiplier the shift-add technique is used: the multiplicand is multiplied by successive digits of the multiplier and the appropriately positioned resulting partial products are added. In binary multiplication, however, each digit can be either 1 or 0; hence each partial product is either equal to the multiplicand or it is zero. Thus, the computation of the Controllability of the multiplier is based on the Controllability of the adder discussed above. Unfortunately, this structure has reconvergent fanout and is thus inexact. It is used on multipliers with n greater than 8, where the exact method based on a truth table becomes too costly.

Controllability of the Output of an N-Bit Comparator

When two unsigned numbers A and B are compared, the relations of interest are (A>B), (A≧B), (A=B), (A≠B), (A≦B) and (A<B). The Controllability (A=B) and (A<B) are computed, and Controllability of the other ones, e.g., $C_1(A>B) = C_0(A \leq B)$ are deduced. Let the two n-bit numbers to be compared have the form: $A=A_{n-1}A_{n-2} \ldots A_0$ and $B=B_{n-1}B_{n-2} \ldots B_0$.

The 1-Controllability of the output of a 1-bit equality comparator is:

$$C_1(A_i = B_i) = 1 - C_1(A_i \oplus B_i)(\forall i=0, \ldots, n-1) \quad (4)$$

Therefore, the Controllability of the output of an n-bit equality comparator becomes:

$$C_1(A = B) = \prod_{i=0}^{n-1} C_1(A_i = B_i) \quad (5)$$

The logic equation for (A<B) may be written as:

$$(A<B) = ((A_{n-1} < B_{n-1}) \vee (A_{n-1} = B_{n-1}) \wedge (A_{n-2} < B_{n-2})) \ldots \wedge ((A_{n-1} = B_{n-1}) \wedge (A_{n-2} = B_{n-2}) \wedge \ldots \wedge (A_1 = B_1)) \wedge (A_0 < B_0).$$

The 1-Controllability of (A<B) is thus given by the following formula:

$$C_1(A<B) = C_1(A_{n-1} < B_{n-1}) +$$

$$\sum_{i=1}^{n-1} \left( C_1(A_{n-1-i} < B_{n-1-i}) \times \prod_{j=1}^{i} C_1(A_{n-j} = B_{n-j}) \right) \quad (6)$$

Controllability of the Output of a Multiplexer

Consider a multiplexer of n control inputs ($c_0 c_1 \ldots c_{n-1}$) and $2^n$ possible data inputs, ($A_0 A_1 \ldots A_{2^n-1}$) in which each input $A_i$ and the corresponding output consist of m bits. The 1-Controllability of the output is taken as the sum of the 1-Controllabilities of the inputs combined with the 1-Controllabilities of the control inputs. The general formula to compute the Controllability at the output is as follows:

$$C_1(S(k)) = \sum_{i=0}^{2^n-1} C_1(A_i(k)) \times C_1(control, A_i(k)), \text{ where} \quad (7)$$

k=0, 1, ... m-1, i=0, 1, ..., $2^n-1$, m is the number of bits of each input and the outputs, and $C_1$ (control, $A_i$ (k)) is the 1-Controllability on the control inputs such that data input $A_i(k)$ is selected to the output $S_i(k)$.

Controllability of a Fan-Out Stem

A fan-out stem is a point where a driving signal is connected to more than one combinational or register input. These inputs are then the fan-out branches. The Controllability of a fan-out branch is equal to the Controllability of its stem.

Observability Calculations

The following section provides the formulas for determining the Observability of the inputs of a VHDL operation. The Observability formulas of logical operations can be found in P. H. Bardel et al., "built-In Test for VLSI; Pseudorandom Techniques", Wiley Inter-Science, 1987.

Observability of the Inputs of an N-Bit Adder

Consider again the n-bit ripple-carry adder shown in FIG. 4, and compute the Observability on each input as follows. According to the truth table of a 1-bit adder in Table 1, the change on any input, $a_i$, $b_i$ or $c_i$ is always observable at $s_i$. It thus follows that:

$$O(a_i,s_i)=O(b_i,s_i)=O(c_i,s_i)=O(s_i), i=0, \ldots, n-1 \quad (8)$$

The Observability of an input at level i at the other outputs k, k>i, depends on the propagation of the carry from stage i to these outputs. For instance, to observe $a_i$ at $s_k$ such that k=i+1, ..., n-1, $(b_i \oplus c_i)$ and $(a_j \oplus b_j)$ must be set equal to 1, for all j such that i<j≤k. Equation (9) gives the general formula to compute the Observability of each input $a_i$ at outputs k>i, i<k<n. Equation (10) gives the formula to observe the input $a_i$ at the carry output $s_n$.

$$O(a_i, s_k) = \left[ C_1(c_i \oplus b_i) \times \prod_{j=i+1}^{k} C_1(a_j \oplus b_j) \right] \times \quad (9)$$
$$O(s_k), k = 1, \ldots n-1, \text{ and}$$

$$O(a_i, s_n) = \left[ C_1(c_i \oplus b_i) \times \prod_{j=i+1}^{n-1} C_1(a_j \oplus b_j) \right] \times O(s_n) \quad (10)$$

The resulting Observability value of an input i is the maximum value of Equations (8), (9), and (10), i.e., $O(a_i) = \max_{i \leq k \leq n} [O(a_i, s_k)]$. Similar formulas can be used to compute the $O(b_i, S_k)$ and $O(c_i, s_k)$ (in particular for $c_0$).

Observability of the Inputs of an N-Bit Comparator

Consider a comparator with two inputs A and B of the form $A=A_{n-1} A_{n-2} \ldots A_0$ and $B=B_{n=1}B_{n-2} \ldots B_0$, and output S.

The Observability of each input $A_i$ or $B_i$ at the output S of the comparators (A=B) and (A≠B) is computed using Equation (11). The same Equation can be used to compute the Observability of $B_i$ by substituting $B_i$ for $A_i$. To observe any input of the equality comparator, for example $A_i$, i=0, 1, ... n-1 whatever the value of $B_i$, we have to maintain $(A_j=B_j)$, i≠j and j=0, 1, ... n-1.

$$O(A_i, S) = \left[ \prod_{j=0/i \neq j}^{n-1} C_1(A_j = B_j) \right] \times O(S) \quad (11)$$

Figure 5:
FIG. 5 illustrates a binary representation and notation for input A of a comparator.

To compute the observability of inputs of the (A<B) comparator, let $A^+=A_{n-1}, A_{n-2}, \ldots, A_{i+1}$ and $A^-=A_0, A_1, \ldots, A_{i+1}$ (FIG. 5) and define $B^+$ and $B^-$ in a similar fashion.

The operation of this comparator is not commutative and thus different formulas are used to compute the Observability of A and B.

To observe the $A_i$, (A+=B+) must be maintained and, depending on the value of bit $B_i$, the relation between $A^-$ and $B^-$ must be inspected.

The Observability of $A_i$ is computed using the following Equations:

$$O(A_i,S)=O(S) \times P[(A^+=B^+)=1] \times \alpha \text{ for } i=1,2 \ldots, n-2, \text{ where}$$

$$\alpha=P[(A^- \geq B^-)=1] \times C_1(B_i)+P[(A^-<B^-)=1] \times (1-C_1(B_i))$$

$$O(A_i, S)=O(S) \times P[(A^+=B^+)=1] \times C_1(B_i) \text{ for } i=0, \text{ and}$$

$$O(A_i, S)=O(S) \times \alpha \text{ for } i=n-1, \text{ where}$$

$$\alpha=P[(A^- \geq B^-)=1] \times C_1(B_i)+P[(A^-<B^-)=1] \times (1-C_1(B_i))$$

The notation P (x=1) is the probability that x will take the value 1.

Observability of Multiplexer Inputs

Consider again a multiplexer consisting of n control inputs $(c_0 c_1 \ldots C_{n-1})$ and $2^n$ data possible inputs, $(A_0 A_1 \ldots A_{2^n-1})$, in which each input $A_i$ and the output consist of m bits. The Observability of the data inputs is obtained by setting the control inputs the appropriate values for connecting the data input under consideration to the output. The Observability computation for the data inputs is thus:

$$O(A_i(k))=O(S(k)) \times C_1(\text{control}, A_i(k)),$$

where $C_1(\text{control}, A_i(k))$ is the 1-Controllability of the control inputs such that $A_i(k)$ is connected to $S_i(k)$, k=0, 1, ... m-1 and l=0, 1, ..., 2n-1.

The observability of the control inputs is more complicated than the data inputs. For example, consider the case of a 4:1 multiplexer composed of four inputs $A_0, A_1, A_2, A_3$, one output S, and thus two control inputs $c_0, c_1$. For simplicity, assume m=1, i.e., each data input and the corresponding output consist of one bit. To observe $c_0$, it is necessary to consider the possible values of $c_1$. If $c_1$ is 0 a change on $c_0$ from 0 to 1 will change the output from $A_0$ to $A_1$. Therefore, to observe $c_0$ at S when $c_1$ is 0 requires $(A_0 \oplus A_1)=1$. Similarly, $c_1=1$ requires $(A_2 \oplus A_3)=1$. The same analysis can be used for the control input $c_1$ by considering the possible values of $c_0$. The Observability formulas for $c_0$ and $c_1$ are thus as follows:

$$O(c_0,S)=O(S) \times [(1-C_1(c_1)) \times C_1(A_0 \oplus A_1)+C_1(c_1) \times C_1(A_2 \oplus A_3)] \text{ and}$$

$$O(c_1,S)=O(S) \times [(1-C_1(c_0)) \times C_1(A_0 \oplus A_2)+C_1(c_0) \times C_1(A_1 \oplus A_3)]$$

For a general multiplexer, the observability of a control input $c_i$ is computed using the following formula:

$$O(c_i) = \text{Max}_k \left( \sum_{p=D}^{2^{n-i-1}-1} \left( \sum_{j=p \times 2^{i+1}}^{p \times 2^{i+1}+2^i-1} C_1(\beta_j) \times C_1(\text{control}, \beta_j) \right) \times O(S(k)) \right) \quad (12)$$

where k=0, 1, ... m-1, $\beta_j=[A_j(k) \oplus A_{j+2^i}(k)]$ and $C_1(\text{control}, \beta_j)$ is the 1-Controllability of the control inputs such that the inputs $A(k_j)$ and $A_{j+2^i}(k)$ are mutually exclusive, i.e., $\beta_j=1$.

Test Point Insertion at the VHDL Specification

The selection of test points is driven by testability analysis method of the present invention. The following description shows how test points are inserted at VHDL specification to enhance the testability of the circuit.

The Detectability of a fault i in a single-bit signal S is defined as follows: Assuming fault i to denote the stuck-at-1 at signal S, we have:

$$D_{i/1}(S)=(1-C_1(S)) \times O(S) \quad (13)$$

Similarly, if fault i represents the stuck-at-0 fault at signal S, we have:

$$D_{i/0}(S)=C_1(S) \times O(S) \quad (14)$$

A VHDL specification is defined as random testable if each bit of each internal signal/variable has a Detectability value above a given threshold.

The value of the threshold comes from experience and depends on the desired fault coverage, test length, and circuit complexity. Low detectability below the threshold indicates potential Controllability or Observability problems that my negatively impact the quantity of the test of the resulting circuit.

Insertion Mechanism at the VHDL Specification

As indicated in the flowchart in FIG. 1, test point insertion on signals/variables is performed by adding new nodes in the DAG. TMs are then recomputed at 20 to verify the improvement in the testability. If testability not sufficient, as determined at 24, the insertion process is repeated at 26 until all signals/variables achieve a Detectability value above the specified threshold. At that point, new test statements are inserted in the original VHDL specification at 28 that reflect the insertion of nodes in the DAG. Therefore, it is necessary to establish the relationship between the DAG representation and the VHDL specification, in order to locate the correct test statement in the VHDL specification. To that end, each signal/variable candidate for test point insertion is identified by a label, that is the name of the hierarchical path and the line number in the original VHDL specification. A new test statement is then inserted just after the corresponding line depending on the type of the affected signal/variable and the type of the VHDL constructs involved (conditional or simple assignment statements). Indeed two cases are considered for the insertion of test statement at the VHDL specification. The first case is when the affected signal/variable is the output of a mux operation in the DAG representation. This case corresponds to a conditional statement ("if" or "case") in the VHDL specification. The new test statement is added just after the line corresponding to the end-statement in the VHDL specification. The other case occurs when the affected signal/variable is the left part of a sequential assignment statement. In this case, the new test statement is added just after the line corresponding the assignment statement in which the affected signal/variable is used. In both cases, the insertion of the new test statement consists of adding a sequential assignment statement where the affected signal/variable is referenced.

Control and Observation Points at the VHDL Specification

The foregoing description shows where VHDL test statements should be inserted in the original VHDL specification. The following description shows how test statements are inserted to improve the testability of the circuit. Test points can be classified as observation points and control points. An observation point is an additional pseudo-primary output which is inserted to obtain a better observability of some signals in the circuit. An observation point of a signal S improves the observability of S and of signals in the fan-in cone of S. Unlike an observation point which only affects the observability of some signals, a control point influences both the Controllability and the Observability of some signals.

Figure 6A:
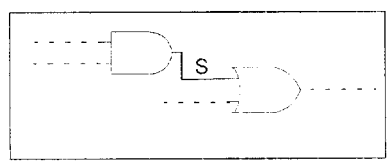
Figure 6B:
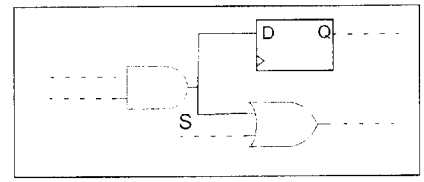
Figure 6C:
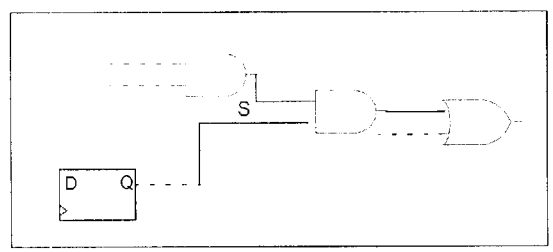

The implementation of observation and control points in the method of the present invention is the same method as used in the gate-level methods such as that disclosed by B. H. Seiss, P. M. Trouborst and M. H. Schulz in "Test Point Insertion for Scan-Based BIST", Proc. of European Test Conference, pp. 253–262, 1991.) FIG. 6 illustrates the implementation of control and observation points in gate-level. Suppose it is desired to insert a test point at signal S (FIG. 6(a)). In the case of an observation point, an additional fanout branch is introduced at signal S and routed to a Flip-Flop to be included in the scan chain (FIG. 6(b)). Conversely, in the case of a control point, a two-input AND-gate or a two-input OR gate is inserted, depending on whether it is desired to decrease or increase the one Controllability on signal S.

Control Points Insertion at VHDL Specification

The following description describes how to increase the Controllability on a signal/variable candidate for test point insertion. This can be achieved by adding a new statement to the VHDL specification. FIG. 7(a) shows an example of a VHDL specification and its DAG representation (FIG. 7(b)). It will be shown how to increase the 0-Controllability value of variable V of type bit shown as a dotted edge in FIG. 7(b). A logical AND operation is used to combine this variable and a control input Test_In which comes from a register to be included in the scan chain (FIG. 7(c)). The variable V is the left part of the second assignment statement in the process and thus a new test statement is added just after this statement line. The test statement consists of a function that is defined in a package to insert a control point, a logical AND or logical OR operation depending on the type of the control point to insert. A Boolean constant Ctrp is used to select between the control point type to insert (AND or OR). Test mode is selected by the signal, Test_Mode. The function to be inserted in the VHDL specification is shown in bold type in FIG. 7(d).

FIG. 8(a) illustrates another example which uses a conditional "if" statement and all signals/variables are declared as integers. After type conversion, the DAG representation shown in FIG. 8(a) is obtained. Suppose now that it is desired to increase the 1-Controllability of the first bit of variable V, V(0), shown as a dotted edge in the DAG in FIG. 8(b). The resulting modification of the DAG is shown in FIG. 8(c). In this case, the affected variable is the output of a multiplexer operation inferred by the "if" statement and thus a new test statement is added after the corresponding "end-if" statement. In addition, the variable V is of type integer. In this case, the test statement at the VHDL level, consists of a function which converts V from integer to bit_vector and inserts an OR control point on V(0) and then converts the bit_vector back to the integer type, as shown in FIG. 8(d). The function is called Insert_Test_Point, shown in bold type inserted after the "end-if" statement. Note that an additional signal, position, is used to indicate the bit whose 1-Controllability is increased.

In a similar manner a specific bit position is modified for signals/variables declared as enumerated data types. Indeed, a signal/variable declared as an enumerated type can be converted to integer and vice-versa.

Implementation of Observation Points

The following description explains how to increase the Observability on a signal/variable at the VHDL level. Registers to be placed on the scan chain are used to enhance the Observability on a signal/variable. FIG. 9 shows an example illustrating how to observe the signal Z (shown as a dotted edge in FIG. 9(b)) by loading it in the register Reg in test mode. A simple clocked process is added for this purpose FIG. 9(d).

Testability Analysis Algorithm

The present invention uses a greedy algorithm for selecting control and observation points as used in other methods (see for example: Youssef M., Y. Savaria, and B. Kaminska "Methodology for Efficiently Inserting and Condensing Test Points", IEE Proceedings-E, Vol 140, No. 3, pp. 154–160, May 1993 and C. H. Cho and J. Armstrong, "B-algorithm: A Behavior Test Generation Algorithm", IEEE International Test Conference, 1994, pp. 968–979. ) However, any efficient test point insertion method can be used to select the best test points to enhance the overall testability of the system.

The testability insertion process starts with the calculation of the Detectability value of each bit of each signal/variable declared in the VHDL specification. Those signals/variables with low Detectability values below a given threshold are candidates for test insertion. First, those signals/variables considered as candidates with low Controllability values below the threshold are candidates for controllable points insertion. Of the candidates, the candidate nearest the primary inputs is selected; this is because controllable point insertion will affect the Controllability values not only of the insertion point, but also of all signals/variables driven by the insertion point. Once the insertion is done to improve Controllability at the selected signals/variables, the Controllability values are recomputed, and the process iterates until all Controllability values are above the threshold.

Once all Controllability values of signals/variables are acceptable, the analysis considers the Observabilities. Decisions to improve Observabilities are deferred because a change in Controllability may affect the Observability, but a change in the Observability has no effect on Controllability. First Observability values are computed for all signals/variables. All signals/variables with Observability value below the threshold are considered candidates for observable point insertion; of the candidates, the candidate closest to primary outputs is selected. Once observable point insertion has been done to improve the Observability of the selected signal/variable, all Observabilities are recomputed, and the process iterates until all Observability values are above the threshold.

Experimental Results

The following description outlines preliminary results obtained by applying the present invention to some benchmark circuits and demonstrates the effectiveness and the viability of the method for deriving a testable design form the original specification on some design examples given in synthesizable VHDL specification. This can be achieved by verifying the correlation between the present testability analysis and test statement insertion at the RT-Level VHDL specification and test generation at gate level. Indeed, each considered circuit example is synthesized into a gate-level netlist before and after test statement insertion at the VHDL specification. The ATPG tool is used to evaluate the fault coverage of the gate-level netlist before and after the insertion of test statements. Then, the obtained fault coverages are compared and thus verify the influence of the test point insertion guided by testability analysis results at RT-Level. The considered benchmark circuits used to validate the method come from Simplicity Inc. 1994–1996 and synthesized by Synopsys tools. The Synopsys ATPG tool is also used to evaluate the fault coverage at gate level with the full scan option with only random pattern generation.

The example circuits information are shown in Table 2. For each circuit, the number of primary inputs, the number of primary outputs, the number of Flip-Flops and a description are given. All of the example specifications consist of control as well as data operations, as opposed to data intensive designs applicable like DSP applications.

For each circuit, a sequence of random test patterns is generated before and after the insertion of test statements at the VHDL specification. Then, the corresponding fault coverage at gate-level are reported in order to demonstrate the efficiency of the method of the present invention. Table 3 and Table 4 present the results of this stimulation using a random sequence of 5K (10K) patterns. Also, for each circuit the number of test statements is given, #TS, added to the VHDL specification to achieve the required fault coverage. Each test statement is applied to a single bit of the affected signal/variable.

From Tables 3 and 4, it can be seen that for all circuits, the increasing of fault coverage with the given test length with a small number of test statements. This can prove the considerable improvements in the circuit's random pattern testability and hence the accurate estimation of the present testability analysis method. Therefore, the results conform well to the patentee's predictions of testability analysis method at the VHDL specification. It is observed that there is a small improvement in fault coverage for circuit 2. The VHDL specification of this circuit consists mainly of data transfer operations of constants to signals. For such descriptions, the synthesis tool performs constant propagation and this is not considered in the method of the present invention.

TABLE 2

Circuit information

| Circuit | No. of inputs | No of outputs | Flip-Flops | Description |
|---|---|---|---|---|
| circuit 1 | 18 | 8 | 8 | Timer/counter: 8 bit registers, a mux, counter and comparator |
| circuit 2 | 9 | 8 | 4 | Small state machine of 9 states |
| circuit 3 | 8 | 8 | 5 | Large state machine of 17 states |
| circuit 4 | 16 | 16 | — | Sixteen bit counter with test logic |
| circuit 5 | 17 | 17 | — | Memory mapper |

TABLE 3

Experimental Results after 5K Random Patterns

| Circuit Name | Before Test Statement Insertion FC (%) | After Test Statement Insertion FC (%) | #TS |
|---|---|---|---|
| circuit 1 | 99.81 | 100 | 2 |
| circuit 2 | 95.10 | 95.97 | 6 |
| circuit 3 | 95.88 | 98.27 | 7 |
| circuit 4 | 90.42 | 93.46 | 8 |
| circuit 5 | 81.47 | 88.56 | 10 |

TABLE 4

Experimental Results after 10K Random Patterns

| Circuit Name | Before Test Statement Insertion FC (%) | After Test Statement Insertion FC (%) | #TS |
|---|---|---|---|
| circuit1 | 100 | 100 | 2 |
| circuit2 | 98.69 | 98.73 | 6 |
| circuit3 | 97.25 | 98.85 | 7 |
| circuit4 | 91.67 | 94.16 | 8 |
| circuit5 | 91.38 | 97.45 | 10 |

The present invention provides a new testability analysis and test point insertion method for designs described in synthesizable VHDL specifications. The method of the present invention is able to detect each bit of the hard-to-detect signals/variables at RT-Level VHDL specification using an efficient method of testability analysis. Test statement insertion is also performed again at the VHDL level depending on the type of VHDL constructs (integer, enumerated, bit, array of bits). The computational complexity of testability analysis of the present invention is much lower and more accurate when compared to the gate-level methods. The achieved results conform well the prediction of the patentees' testability estimation at the VHDL specification. In fact, a primary difference when compared to other methods is the use of each bit of each signal/variable for testability analysis and insertion for integer, enumerated and array of bits. This makes the test statement insertion more oriented to the hardware represented by the VHDL specification.

We claim:

1. A method of producing a synthesizable RT-Level specification having testability enhancement from a staring RT-Level specification representative of a circuit to be designed, for input to a synthesis tool to generate a gate-level circuit, the method comprising the steps of:

(a) performing testability analysis on a Directed Acyclic Graph, formed by the transformation of an Intermediate Format representation of said starting RT-Level specification by computing and propagating Testability Measures (TMs) forward and backward through statements of said Directed Acyclic Graph including computing a Combinational Controllability, defined as the probability that a signal has a predetermined value, and a Combinational Observability, defined as the probability that a signal change on a line, l, will result in a signal change on an output, s, and, for a specification having multiple output modules, computing the Observability of a line relative to each output and computing an overall Observability O(l) of line l given by $\max_s$;

(b) identifying the bits of each signal and/or variable, obtained in step (a), on which faults are hard to detect; and (c) adding test point statements into said specification at the RT-Level to improve testability of said circuit to be designed.

2. A method as defined in claim 1, wherein said computing the Combinational Controllability includes computing a 1-Controllability Measure, $C_1(s)$, and 0-Controllability measure, $C_0(s)$, such that $C_0(s)=1-C_1(s)$.

3. A method, as defined in claim 2, wherein, for an n-bit adder comprising a plurality of outputs, the 1-Controllability Measures of each output is computed by the following three equations:

$$C_1(s_i) = \alpha + C_1(c_i) - 2\times(\alpha \times C_1(c_i)) \quad (1)$$

$$C_1(c_{i+1}) = \alpha \times C_1(c_i) + C_1(a_i) \times C_1(b_i) \quad (2)$$

$$\text{where } \alpha = C_1(a_i) + C_1(b_i) - 2\times C_1(a_i) \times C_1(b_i) \quad (3)$$

and is the probability that $(a_i \oplus b_i)=1$ and $C_1(s_i)$ is the probability that $(a_i \oplus b_i \oplus c_i)=1$ wherein $a_i$ and $b_i$ are input bits and $c_i$ is a carry bit.

4. A method, as defined in claim 3, wherein computing a Controllability of each output of said n-bit adder further comprising the steps of:

providing a cascade of n full adders, with each n full adder configured as a ripple-carry adder; and determining the Controllability measure, $C_1(s_i)$, at output $s_i$, for each bit, i, using said three equations for each n-bit adder after the controllability measure of bits 0, 1, . . . , i−1 have been computed.

5. A method, as defined in claim 4, further including computing a Controllability of a subtractor by said providing and determining steps, but using a 2's-complement representation.

6. A method, as defined in claim 1, wherein the Controllability of the output, for an n-bit equality comparator of two n-bit numbers A and B having the form $A=A_{n-1} A_{n-2} \ldots A_0$ and $B=B_{n-1}B_{n-2} \ldots B_0$, computing the Controllability of the output of said comparator as follows:

$$C_1(A = B) = \prod_{i=0}^{n-1} C_1(A_i = B_i). \quad (5)$$

7. A method, as defined in claim 2, wherein, for an n-bit inequality comparator of two n-bit numbers A and B having the form $A=A_{n-1} A_{n-2} \ldots A_0$ and $B=B_{n-1}B_{n-2} \ldots B_0$, computing the 1-Controllability of the output of said comparator as follows:

$$C_1 \;\dashv\!\!\vdash\; (A < B) = C_1(A_{n-1} < B_{n-1}) + \sum_{i=1}^{n-1}\left(C_1(A_n-1-i < B_n-1-i)\times \prod_{j=i}^{i} C_1(A_n-j = B_n-j)\right). \quad (6)$$

8. A method, as defined in claim 1, wherein, for an n-bit multiplier, computing the Controllability of the outputs of said multiplier comprising the steps of performing a shift-add operation in which a multiplicand is multiplied by successive digits of a multiplier and adding resulting partial products.

9. A method, as defined in claim 8, further including performing said shift-add operation only with respect to n-bit multipliers in which n is greater than 8.

10. A method, as defined in claim 1, further including computing the Controllability of a fan-out branch having a stem by setting it equal to the Controllability of said stem.

11. A methods as defined in claim 1, wherein, for a general multiplexer having n control inputs ($c_0$, $c_1$, . . . , $c_{n-1}$) and $2^n$ data possible inputs, ($A_0, A_1, \ldots, A_{2^n-1}$), in which each input $A_i$ and an output comprises m bits, computing the Combinational observability of a control input $c_i$ comprises evaluating the following equation:

$$O(c_l) = \quad (12)$$

$$\text{Max}_k\left(\sum_{p=D}^{2^{n-i-1}-1}\left(\sum_{j p \times 2^{i+1}}^{p\times 2^{i+1}+2^i-1} C_1(\beta_j)\times C_1(control,\,\beta_j)\right)\times O(S(k))\right)$$

where k=0, 1, . . . m−1, $\beta_j=[A_j(k) \oplus A_{j-2}{}^i(k)]$ and $C_1(\text{control}, \beta_j)$ is the 1-Controllability of the control inputs such that the inputs $A_j(k)$ and $A_{j+2}{}^i(k)$ are mutually exclusive, i.e., $\beta_j=1$.

12. A method, as defined in claim 1, said step of identifying bits of each signal and/or variable on which faults are hard to detect comprising:

calculating a detectability value for each said signal and/or variable; and identifying a signal and/or variable as hard to detect when its associated detectability value is below a predetermined threshold.

13. A method, as defined in claim 12, wherein the detectability value, D, of a stuck-at-1 fault, i, in a single-bit signal, S, is calculated as:

$$D_{i/1}(S)=(1-C_1(S))\times O(S) \quad (13)$$

and the detectability value, D, of a stuck-at-0 fault, i, in a single-bit signal S is calculated as:

$$D_{i/0}(S)=C_1(S)\times O(S). \quad (14)$$

14. A method, as defined in claim 12, further including the step of repeating said step of performing testability analysis to verify an improvement in the testability of said specification, and, if testability is not sufficient, repeating said step of adding test point statements until all signals/variables achieve a detectability value above said predetermined threshold.

15. A method, as defined in claim 14, further including the step of inserting new test statements in said starting RT-Level specification that reflect an insertion of nodes in said Directed Acyclic Graph.

16. A method, as defined in claim 15, further including a step of inserting new test statements in said starting RT-Level specification which reflect insertion of nodes in the Directed Acyclic Graph.

17. A method as defined in claim 2, wherein, for a multiplexer having n control inputs $(c_0, c_1, \ldots, C_{n-1})$ and $2^n$ possible data inputs, $(A_0, A_1, \ldots, A_{2^n-1})$ in which each input $A_i$ and a corresponding output consists of m bits, computing the combinational Controllability of an output, $S(k)$, of said multiplier comprising computing the 1-Controllability of the output as the sum of the 1-Controllabilities of the inputs combined with the 1-Controllabilities of the control inputs according to the following equation:

$$C_1(S(k)) = \sum_{i=0}^{2^n-1} C_1(A_i(k)) \times C_1(control, A_i(k)) \quad (7)$$

where $k=0, 1, \ldots, m-1$, $i=0, 1, \ldots, 2^n-1$, m is the number of bits of each input and the outputs, and $C_1(control, A_i(k))$ is the 1-Controllability of the control inputs such that data input $A_i(k)$ is selected to the output $S_i(k)$.

18. A method as defined in claim 1, wherein, for an n-bit adder, computing the Observability of inputs $a_i$ at outputs $S_k$, such that $k>i$ and $i<k<n$, of said n-bit adder comprises evaluating the following equation for each input:

$$O(a_i, s_k) = \left[ C_1(c_i \oplus b_i) \times \prod_{j=i+1}^{k} C_1(a_j \oplus b_j) \right] \times \quad (9)$$

$O(s_k), k = 1, \ldots n-1$, and and computing the observability of input $a_i$ at a carry output $s_n$ by:

$$O(a_i, s_n) = \left[ C_1(c_i \oplus b_i) \times \prod_{j=i+1}^{n-1} C_1(a_j \oplus b_j) \right] \times O(s_n) \quad (10)$$

where $a_i$, $b_i$ and $c_i$ are inputs, and $(c_i \oplus b_i) = (a_j \oplus b_j) = 1$ for all j such that $i<j \leq k$.

19. A method as defined in claim 1, wherein, for a comparator having inputs A and B in the form of $A=A_{n-1}$, $A_{n-2}, \ldots A_0$ and $B=B_{n-1}, B_{n-2}, \ldots, B_0$, and an output S, the step of computing a Combinational Observability of an input $A_i$ or $B_i$ at output S comprising:

for comparators (A=B) and (A≠B), evaluating input $A_i$ according to the following equation:

$$O(A_i, S) = \left[ \prod_{j=0/i \neq j}^{n-1} C_1(A_j = B_j) \right] \times O(S), \quad (11)$$

evaluating input $B_i$ by substituting $B_i$ for $A_i$ in equation (11) and, for an equality comparator (A=B), evaluating $A_i$, for any value of $B_i$, by maintaining $(A_j=B_j)$, for i≠j and j=0, 1, ... n−1 and i=0, 1, ... n−1;

for a comparator (A<B), with $A^+=A_{n-1}, A_{n-2}, \ldots, A_{j+1}$ and $A^-=A_0, A_1, \ldots, A_{i-1}$ and $B^+=B_{n-1}, B_{n-2}, \ldots, B_{i+1}$ and $B^+=B_0, B_1, \ldots, B_{i-1}$, to observe $A_i$, maintaining (A+=B+) and, computing the Observability of $A_i$ according to the following equations:

$O(A_i,S)=O(S) \times P[(A^+ + B^+)=1] \times \alpha$ for i=1,2 ..., n−2, where $\alpha + P[(A^- \geq B^-)=1] \times C_1(B_i) + P[(A^- < B^-)=1] \times (1-C_1(B_i))$, and $O(A_i,S)=O(S) \times P[(A^+ < B^+)=1] \times C_1(B_i)$ for i=0, and $O(A_i,S)=O(S) \times \alpha$ for i=n−1, where $\alpha = P[(A^- < B^-)=1] \times C_1(B_i) + P[(A^- < B^-)=1] \times (1-C_1(B_i))$ and notation P (x=1) is the probability that x will take the value 1.

20. A method, as defined in claim 13, said step of adding test point statements comprising:

(a) calculating a detectability value for each single-bit of each signal and variable declared in said specification, and identifying signals and variables with detectability values below a predetermined detectability threshold as candidates for test point insertion;

(b) inserting controllable test points, further comprising:
  i. identifying from said candidates for test point insertion, signals and variables with controllability values below a predetermined controllability threshold as candidates for controllable test point to insertion;
  ii. from said candidates for controllable test point insertion, inserting a controllable test point for a signal or variable nearest a primary input;

(c) repeating said inserting controllable test points until all controllability values are above the predetermined threshold;

(d) inserting observation test points, further comprising:
  i. computing an observability value for all signals and variables declared in said specification;
  ii. identifying all signals and variables with an observability value below an observability threshold as candidates for observation test point insertion;
  iii. from said candidates for observation test point insertion, inserting an observation test point at a signal or variable nearest a primary output; and (e) repeating said inserting observation test points until all observability values are above said observability threshold.

21. A method as defined in claim 4, further including computing a Controllability of a subtractor by said providing and determining steps, but using a 2's-complement representation.

22. A method as defined in claim 21, wherein, the Controllability of the output for an n-bit equality comparator of two n-bit numbers A and B having the form $A=A_{n-1} A_{n-2} \ldots A_0$ and $B=B_{n-1}B_{n-2} \ldots B_0$, computing the Controllability of the output of said comparator as follows:

$$C_1(A = B) = \prod_{i=0}^{n-1} C_1(A_i = B_i). \quad (5)$$

23. A method as defined in claim 22, wherein, for an n-bit inequality comparator of two n-bit numbers A and B having the form $A=A_{n-1} A_{n-2} \ldots A_0$ and $B=B_{n-1}B_{n-2} \ldots B_0$, computing the 1-Controllability of the output of said comparator as follows:

$C_1(A<B)=C_1(A_{n-1}<B_{n-1})+$ $$C_1(A < B) = C_1(A_{n-1} < B_{n-1}) + \quad (6)$$
$$\sum_{i=1}^{n-1} \left( C_1(A_n - 1 - i < B_n - 1 - i) \times \prod_{j=1}^{i} C_1(A_n - j = B_n - j) \right).$$

24. A method as defined in claim 23, wherein, for an n-bit multiplier, computing the combinational Controllability of the outputs of said multiplier comprising performing a shift-add operation in which a multiplicand is multiplied by successive digits of a multiplier and adding appropriately positioned resulting partial products.

25. A method as defied in claim 24, performing wherein said shift-add operation only with respect to n-bit multipliers in which n is greater than 8.

26. A method as defined in claim 25, wherein, for a multiplexer having n control inputs $(c_0, c_1, \ldots, c_{n-1})$ and $2^n$ possible data inputs, $(A_0, A_1, \ldots, A_{2^n-1})$ in which each input $A_i$ and a corresponding output, consists of m bits, computing the combinational Controllability of the output, S(k), of said multiplier comprising computing the 1-Controllability of the output as the sum of the 1-Controllabilities of the inputs combined with the 1-Controllabilities of control inputs according to the following equation:

$$C_1(S(k)) = \sum_{i=0}^{2^n-1} C_1(A_i(k)) \times C_1(control, A_i(k)) \quad (7)$$

where $k=0, 1, \ldots, m-1$,
$i=0, 1, \ldots, 2^n-1$,
m is the number of bits of each input and the outputs, and
$C_1$(control, $A_i$(k)) is the 1-Controllability of the control inputs such that data input $A_i$(k) is selected to the output $S_i$(k).

27. A method as defined in claim 26, further including computing the Controllability of a fan-out branch including an inherent stem, by setting the fan-out branch equal to the Controllability of the stem.

28. A method as defined in claim 27, wherein, for an n-bit adder, computing the Observability of inputs $a_i$ at outputs $s_k$, such that k>i and i<k<n, of said adder comprises evaluating the following equation for each n-bit input:

$$O(a_i, s_k) = \left[ C_1(c_i \oplus b_i) \times \prod_{j=i+1}^{k} C_1(a_j \oplus b_j) \right] \times \quad (9)$$
$$O(s_k), k = 1, \ldots n-1, \text{ and}$$

and computing the observability of input $a_i$ at a carry output $S_n$ by:

$$O(a_i, s_n) = \left[ C_1(c_i \oplus b_i) \times \prod_{j=i+1}^{n-1} C_1(a_j \oplus b_j) \right] \times O(s_n) \quad (10)$$

where $a_i$, $b_i$ and $c_i$ are inputs, and $(b_j \oplus c_j)=(a_j \oplus b_j)=1$ for all j such that $i<j \leq k$.

29. A method as defined in claim 28, wherein, for a comparator having inputs A and B in the form of $A=A_{n-1}, A_{n-2}, \ldots A_0$ and $B=B_{n-1}, B_{n-2}, \ldots, B_0$, and an output S, the step of computing a Combinational Observability of an input $A_i$ or $B_i$ at output S comprising:
for comparators (A=B) and (A≠B), evaluating input $A_i$ according to the following equation:

$$O(A_i, S) = \left[ \prod_{j=0/i \neq j}^{n-1} C_1(A_j = B_j) \right] \times 0(S), \quad (11)$$

evaluating input $B_i$ by substituting $B_i$ for $A_i$ in equation (11) and, for an equality comparator (A=B), evaluating $A_i$, for any value of $B_i$, by maintaining $(A_j=B_j)$, for $i \neq j$ and $j=0, 1, \ldots n-1$ and $i=0, 1, \ldots n-1$;

for a comparator (A<B), with $A^+=A_{n-1}, A_{n-2}, \ldots, A_{i+1}$ and $A^-=A_0, A_1, \ldots, A_{i+1}$ and $B^+=B_{n-1}, B_{n-2}, \ldots, B_{i+1}$ and $B^-=B_0, B_1, \ldots, B_{i-1}$, to observe $A_i$, maintaining (A+=B+) and, computing the Observability of $A_i$ according to the following equations:

$0(A_i,S)=0(S) \times P[(A^++B^+)=1] \times \alpha$ for $i=1,2 \ldots, n-2$, where $\alpha + P[(A^- \geq B^-)=1] \times C_1(B_i) + P[(A^+<B^+)=1] \times (1-C_1(B_i))$, and $0(A_i,S)=0(S) \times P[(A^+<B^+)=1] \times C_1(B_i)$ for $i=0$, and $0(A_i,S)=0(S) \times \alpha$ for $i=n-1$, where $\alpha = P[(A^-<B^-)=1] \times C_1(B_i) + P[(A^-<B^-)=1] \times (1-C_1(B_i))$ and notation P (x=1) is the probability that x will take the value 1.

30. A method as defined in claim 29, wherein, for a general multiplexer having n control inputs $(c_0, c_1, \ldots, c_{n-1})$ and $2^n$ data possible inputs, $(A_0, A_1, \ldots, A_{2^n-1})$, in which each input $A_i$ and an output comprises m bits, computing the Combinational observability of n control input $c_i$ comprises evaluating the following equation:

$$C(c_i) = \text{Max}_k \left( \sum_{p=0}^{2^{n-i-1}-1} \left( \sum_{jp \times 2^{i+1}}^{p \times 2^{i,1}+2^i-1} C_1(\beta_j) \times C_1(control, \beta_j) \right) \times O(S(k)) \right) \quad (12)$$

where $k=0, 1, \ldots m-1$, $\beta_j=[A_j(k) \oplus A_{j+2}{}^i(k)]$ and
$C_1$(control, $\beta_j$) is the 1-Controllability of the control inputs such that the inputs $A_j(k)$ and $A_{j+2}{}^i(k)$ are mutually exclusive, i.e., $\beta_j=1$.

31. A method as defined in claim 30, said step of identifying bits of each signal and/or variable on which faults are hard to detect comprising:
calculating a detectability value for each said signal and/or variable; and
identifying a signal and/or variable as hard to detect when its associated detectability value is below a predetermined threshold.

32. A method as defined in claim 31, wherein the detectability value, D, of a stuck-at-1 fault, i, in a single-bit signal, S, is calculated as:

$$D_{i/1}(S)=(1-C_1(S))\times O(S) \quad (13)$$

and the detectability value, D, of a stuck-at-0 fault, i, in a single-bit signal S is calculated as:

$$D_{i/0}(S)=C_1(S)\times O(S). \quad (14)$$

33. A method as defined in claim 32, further including the step of repeating said step of performing testability analysis to verify an improvement in the testability of said specification, and, if testability is not sufficient, repeating said step of adding test point statements until all signals/variables achieve a detectability value above said predetermined threshold.

34. A method as defined in claim 33, further including the step of inserting new test statements in said starting RT-Level specification that reflect an insertion of nodes in said Directed Acyclic Graph.

35. A method as defined in claim 34, further including a step of inserting new test statements in said starting RT-Level specification which reflect insertion of nodes in the Directed Acyclic Graph.

36. A method as defined in claim 35, said step of adding test point statements comprising:

(a) calculating a detectability value for each single-bit of each signal and variable declared in said specification, and identifying signals and variables with detectability values below a predetermined detectability threshold as candidates for test point insertion;

(b) inserting controllable test points, further comprising:
  i. identifying from said candidates for test point insertion, signals and variables with controllability values below a predetermined controllability threshold as candidates for controllable test point insertion;
  ii. from said candidates for controllable test point insertion, inserting a controllable test point for a signal or variable nearest a primary input;

(c) repeating said inserting controllable test points until all controllability values are above the pre-determined threshold;

(d) inserting observation test points, further comprising:
  i. computing an observability value for all signals and variables declared in said specification;
  ii. identifying all signals and variables with an observability value below an observability threshold as candidates for observation test point insertion;
  iii. from said candidates for observation test point insertion, inserting an observation test point at a signal or variable nearest a primary output; and (e) repeating said inserting observation test points until all observability values are above said observability threshold.

* * * * *

UNITED STATES PATENT AND TRADEMARK OFFICE
CERTIFICATE OF CORRECTION

PATENT NO. : 6,363,520 B1
DATED : March 26, 2002
INVENTOR(S) : Boubezari et al.

It is certified that error appears in the above-identified patent and that said Letters Patent is hereby corrected as shown below:

<u>Column 15,</u>
Line 7, please replace "staring" with -- starting --

<u>Column 16,</u>
Line 12, please replace the equation with the following equation:
-- $C_1(A < B) = C_1(A_{n-1} < B_{n-1}) +$ --
Line 40, please replace the equation with the following equation:

-- $$O(c_i) = Max_k \left( \sum_{p=0}^{2^{n-i-1}-1} \left( \sum_{j\,px2^{i+1}}^{px2^{i+1}+2^i-1} C_1(\beta_j) \times C_1(control, \beta_j) \right) \times O\,(S(k)) \right)$$ --

<u>Column 18,</u>
Line 10, please replace "$A_{j+1}$" with -- $A_{i+1}$ --
Line 12, please replace "$B^+$" with -- $B^-$ --
Line 50, please replace the "," after ii with -- . --

<u>Column 19,</u>
Line 14, please delete the duplicative equation

<u>Column 20,</u>
Line 49, please replace the equation with the following equation:

-- $$O(c_i) = Max_k \left( \sum_{p=0}^{2^{n-i-1}-1} \left( \sum_{j\,px2^{i+1}}^{px2^{i+1}+2^i-1} C_1(\beta_j) \times C_1(control, \beta_j) \right) \times O\,(S(k)) \right)$$ --

Signed and Sealed this

Tenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO. : 6,363,520 B1
DATED : March 26, 2002
INVENTOR(S) : Boubezari

It is certified that error appears in the above-identified patent and that said Letters Patent is hereby corrected as shown below:

Column 7,
Line 48, equation 2, please replace the current equation with the following equation:

$$C_1(c_{i+1}) = \alpha \times C_1(c_i) + C_1(a_i) \times C_1(b_i)$$

Column 10,
Lines 40-43, equation 12, please replace the current equation with the following equation:

$$O(ci) = \text{Max}_k \left( \sum_{p=0}^{2^{n-i-1}-1} \left( \sum_{j=p \times 2^{i+1}}^{p \times 2^{i+1}+2^i-1} C_1(\beta_j) \times C_1(control, \beta_j) \right) \times O(S(k)) \right)$$

Column 15,
Line 24, please insert the following equation after the word "$\max_s$":

$$[O(1,s)]$$

Column 16,
Line 3, equation 5, please replace the current equation with the following equation:

$$C_1(A = B) = \prod_{i=0}^{n-1} C_1(A_i = B_i)$$

Line 15, equation 6, please replace the current equation with the following equation:

$$\sum_{i=1}^{n-1} \left( C_1(A_{n-1-i} < B_{n-1-i}) \times \prod_{j=1}^{i} C_1(A_{n-j} = B_{n-j}) \right)$$

Lines 37-40, equation 12, please replace the current equation with the following equation:

$$O(ci) = \text{Max}_k \left( \sum_{p=0}^{2^{n-i-1}-1} \left( \sum_{j=p \times 2^{i+1}}^{p \times 2^{i+1}+2^i-1} C_1(\beta_j) \times C_1(control, \beta_j) \right) \times O(S(k)) \right)$$

UNITED STATES PATENT AND TRADEMARK OFFICE
CERTIFICATE OF CORRECTION

PATENT NO. : 6,363,520 B1
DATED : March 26, 2002
INVENTOR(S) : Boubezari

It is certified that error appears in the above-identified patent and that said Letters Patent is hereby corrected as shown below:

Column 19,
Line 3, equation 5, please replace the current equation with the following equation:

$$C_1(A = B) = \prod_{i=o}^{n-1} C_1(A_i = B_i)$$

Line 17, equation 6, please replace the current equation with the following equation:

$$\sum_{i=1}^{n-1} \left( C_1(A_{n-1-i} < B_{n-1-i}) \times \prod_{j=1}^{i} C_1(A_{n-j} = B_{n-j}) \right)$$

Column 20,
Line 26, please replace "$A_{i+1}$" with -- $A_{i-1}$ --.
Line 33, please replace the equation with the following equation:

$$\alpha + P[(A^- \geq B^-) = 1] \times C_1(B_i) + P[(A^- < B^-) = 1] \times (1 - C_1(B_i))$$

Line 49, equation 12, please replace the current equation with the following equation:

$$O(c_i) = \text{Max}_k \left( \sum_{p=0}^{2^{n-i-1}-1} \left( \sum_{j=p\times 2^{i+1}}^{p\times 2^{i+1}+2^i-1} C_1(\beta_j) \times C_1(control, \beta_j) \right) \times O(S(k)) \right)$$

Signed and Sealed this

Twenty-fourth Day of August, 2004

JON W. DUDAS
Director of the United States Patent and Trademark Office